US012640700B2

(12) United States Patent
Huang

(10) Patent No.: US 12,640,700 B2
(45) Date of Patent: May 26, 2026

(54) ACOUSTIC WAVE DEVICE AND FABRICATION METHOD THEREOF

(71) Applicant: RichWave Technology Corp., Taipei City (TW)

(72) Inventor: Hao-Min Huang, Taipei City (TW)

(73) Assignee: RichWave Technology Corp., Taipei City (TW)

( * ) Notice: Subject to any disclaimer, the term of this patent is extended or adjusted under 35 U.S.C. 154(b) by 278 days.

(21) Appl. No.: 18/500,094

(22) Filed: Nov. 1, 2023

(65) Prior Publication Data

US 2025/0112609 A1     Apr. 3, 2025

(30) Foreign Application Priority Data

Oct. 3, 2023    (TW) ................................. 112137838

(51) Int. Cl.
H03H 3/08        (2006.01)
H03H 9/02        (2006.01)
H03H 9/00        (2006.01)

(52) U.S. Cl.
CPC .......... H03H 3/08 (2013.01); H03H 9/02574 (2013.01); H03H 9/02992 (2013.01); *H03H 2009/0019* (2013.01)

(58) Field of Classification Search
CPC .......... H03H 9/02992; H03H 9/02574; H03H 2009/0019
USPC ................................................. 333/186–192
See application file for complete search history.

(56) References Cited

U.S. PATENT DOCUMENTS

| | | | | |
|---|---|---|---|---|
| 10,250,219 | B2 * | 4/2019 | Hatakeyama | ........ H03H 9/1014 |
| 2009/0224851 | A1 | 9/2009 | Feiertag | |
| 2018/0269849 | A1 * | 9/2018 | Matsumoto | .............. H03H 9/25 |
| 2020/0036360 | A1 * | 1/2020 | Tanaka | ..................... H03H 9/64 |
| 2021/0376816 | A1 | 12/2021 | Bywalez | |

OTHER PUBLICATIONS

Office action mailed on Jun. 17, 2024 for the Taiwan application No. 112137838, filing date Oct. 3, 2023, p. 1-10.

* cited by examiner

*Primary Examiner* — Rakesh B Patel
(74) *Attorney, Agent, or Firm* — Winston Hsu

(57) ABSTRACT

An acoustic wave device and a manufacture method thereof are provided. The acoustic wave device comprises a first substrate, a plurality of first electrodes, a second substrate, a plurality of second electrodes and a film. The first substrate comprises a first surface and a second surface. The plurality of first electrodes are disposed on the second surface of the first substrate. The second substrate comprises a third surface and a fourth surface. The plurality of second electrodes are disposed on the third surface of the second substrate. The second surface of the first substrate faces the third surface of the second substrate, such that the plurality of first electrodes and the plurality of second electrodes are arranged between the first substrate and the second substrate. The film is disposed between the plurality of first electrodes and the plurality of second electrodes.

22 Claims, 4 Drawing Sheets

ACOUSTIC WAVE DEVICE AND FABRICATION METHOD THEREOF

TECHNICAL FIELD

The invention relates to an acoustic wave device, in particular to a surface acoustic wave device and a fabrication method thereof.

BACKGROUND

Surface acoustic wave (SAW) devices may be used to convert and transmit electrical and acoustic signals, and thus be widely used in many fields. For example, SAW filters may be used to filter out noise and provide wireless signals in a desirable frequency band, resulting in a lower transmission loss and/or a stronger electromagnetic interference resistibility. With additional advantages of a compact size, SAW filters may be widely used in various communication products. In addition, SAW filters may also be used as resonators.

With the development of communication technology, increasing number of frequency bands may be used in communication products, such as mobile phones, so as to achieve a wider signal coverage and/or a stronger international roaming capability. Therefore, an increasing demand for dual-surface acoustic wave (dual-SAW) devices or even multi-surface acoustic wave (multi-SAW) devices may be desired, and in such cases, the footprint or circuit area occupied by these devices may be a critical concern.

SUMMARY

An embodiment of the present invention may disclose an acoustic wave device. The acoustic wave device may comprise a first substrate, a plurality of first electrodes, a second substrate, a plurality of second electrodes and a first film. The first substrate may comprise a first surface and a second surface. The plurality of first electrodes may be disposed on the second surface of the first substrate. The second substrate may comprise a third surface and a fourth surface. The plurality of second electrodes may be disposed on the third surface of the second substrate. The second surface of the first substrate faces the third surface of the second substrate, such that the plurality of first electrodes and the plurality of second electrodes may be arranged between the first substrate and the second substrate. The first film may be disposed between the plurality of first electrodes and the plurality of second electrodes.

Another embodiment of the present invention may disclose a method of fabricating an acoustic wave device. The method may comprise providing a first chip comprising a first substrate, a first electrode and a first film; providing a second chip comprising a second substrate and a second electrode; stacking the second chip on the first chip such that the first electrode and the second electrode may be arranged between the first substrate and the second substrate and the first film may be disposed between the first electrode and the second electrode.

DETAILED DESCRIPTION

Figure 1:
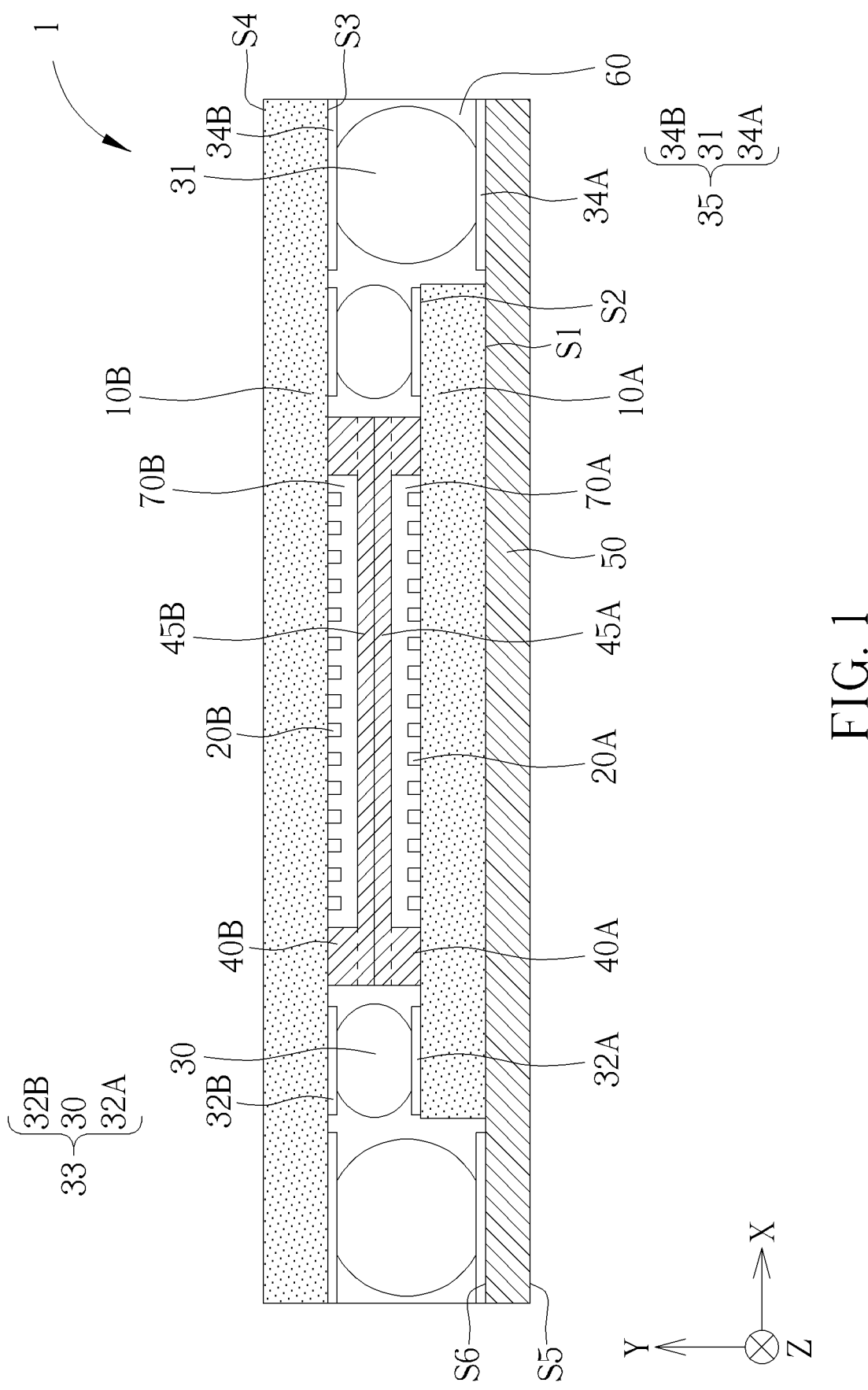
FIG. 1 is a schematic cross-sectional view of an acoustic wave device according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts may be omitted for clarity, and like reference numerals may refer to like elements throughout.

FIG. 1 is a schematic cross-sectional view of an acoustic wave device 1 according to an embodiment of the present invention. In some embodiments, the acoustic wave device 1 may receive a radio frequency signal from an antenna, convert the radio frequency signal into an acoustic wave, process the acoustic wave to generate a filtered signal, and output the filtered signal. The radio frequency signal and the filtered signal may be electrical signals. The acoustic wave device 1 may include two surface acoustic wave (SAW) components, and may be used for a duplexer in the field of wireless communication. For example, two SAW devices may be respectively used to filter two signals with different frequencies. The application of the acoustic wave device 1 set forth here may merely be illustrative, and the present invention may not be such limited. In other embodiments, the acoustic wave device 1 may also be used for other applications.

As shown in FIG. 1, the acoustic wave device 1 may include a substrate 10A, a plurality of electrodes 20A, and a film 45A. The substrate 10A may include a first surface S1 and a second surface S2. The plurality of electrodes 20A may be disposed on the second surface S2 and the film 45A may cover on the plurality of electrodes 20A. The acoustic wave device 1 may further include a substrate 10B, a plurality of electrodes 20B, and a film 45B. The substrate 10B may include a third surface S3 and a fourth surface S4. The plurality of electrodes 20B may be disposed on the third surface S3, and the film 45B may cover on the plurality of electrodes 20B. For example, the width of the substrate 10A along a horizontal direction X may be smaller than the width of the substrate 10B along the horizontal direction X, and the horizontal direction X may be in parallel to the surface S1 of the substrate 10A. In some embodiments, the substrate 10A, the plurality of electrodes 20A, and the film 45A may be formed as a part of a first chip, while the substrate 10B, the plurality of electrodes 20B, and the film 45B may be formed as a part of a second chip.

In some embodiments, the plurality of electrodes 20A and the plurality of electrodes 20B may respectively be configured as interdigital transducers (IDT). For example, the plurality of electrodes 20A disposed on the surface S2 of the substrate 10A may be used to output a first filtered signal with a first frequency. The plurality of electrodes 20B disposed on the surface S3 of the substrate 10B may be used to output a second filtered signal with a second frequency, and the second frequency may be identical with or different from the first frequency. For example, the first frequency may be 900 megahertz (MHz), and the second frequency may be 1800 MHz.

In such an embodiment, for example, the second chip may be stacked on the first chip to save circuit area, thereby achieving miniaturization of the acoustic wave device 1. For example, the surface S3 of the substrate 10B may be configured to face the surface S2 of the substrate 10A, such that the electrodes 20A and 20B may be arranged between the substrate 10A and the substrate 10B, and in more detail, between the surface S2 of the substrate 10A and the surface S3 of the substrate 10B. In some embodiments, the film 45A and/or 45B may be disposed between the electrodes 20A and the electrodes 20B, so as to protect the electrodes 20A and/or the electrodes 20B from contamination or collapsing. For example, the film 45B may be stacked on the film 45A and may directly contact the film 45A. However, the present invention may be not limited thereto, and in other embodiments, the film 45B may be separated from the film 45B. Alternatively, in another embodiment, the film 45A or the film 45B may be omitted.

In some embodiments, the acoustic wave device 1 may further include a side wall 40A and/or a side wall 40B. For example, the sidewall 40A may be disposed on the surface S2 of the substrate 10A, and may at least partially surround the plurality of electrodes 20A. On the surface S2, the side wall 40A may completely surround or partially surround the plurality of electrodes 20A. For example, the side wall 40A may have a substantially complete rectangular shape, so as to completely surround the plurality of electrodes 20A. In another example, the sidewall 40A may have a substantially incomplete rectangular shape, for example, with at least one cut, so as to partially surround the plurality of electrodes 20A. As shown in FIG. 1, the film 45A may be disposed on the side wall 40A, such that the film 45A, the side wall 40A, and the substrate 10A are configured to form a cavity 70A, within which the plurality of electrodes 20A are accommodated. Similarly, the side wall 40B may be disposed on the surface S3 of the substrate 10B, and may at least partially surround the plurality of electrodes 20B. On the surface S3, the side wall 40B may completely surround or partially surround the plurality of electrodes 20B. For example, the side wall 40B may be have a substantially complete rectangular shape, so as to completely surround the plurality of electrodes 20B. In another example, the sidewall 40B may be have a substantially incomplete rectangular shape, for example, with at least one cut, so as to partially surround the plurality of electrodes 20B. As shown in FIG. 1, the film 45B may be disposed on the side wall 40B, such that the film 45B, the side wall 40B, and the substrate 10B are disposed to form a cavity 70B, within which the plurality of electrodes 20B are accommodated.

Furthermore, the side walls 40A and 40B may be at least partially aligned with each other along a vertical direction Y, and the vertical direction Y may be perpendicular to the surface S1 of the substrate 10A. In the embodiment shown in FIG. 1, the side walls 40A and 40B may be substantially completely aligned with each other. However, the present invention may be not limited thereto, and in other embodiments, the side wall 40A may be not completely aligned with the side wall 40B, and for example, the side wall 40A may be offset by a distance along the horizontal direction X from the side wall 40B.

In further embodiments, within the cavity 70A, a first passivation layer (not illustrated) may be disposed on the electrodes 20A, for example, covering on the electrodes 20A, so as to protect the electrodes 20A from contamination. Within the cavity 70B, a second passivation layer (not illustrated) may be disposed on the electrodes 20B, for example, covering on the electrodes 20B, so as to protect the electrodes 20B from contamination.

The material for the substrates 10A and/or 10B may include a piezoelectric material. For example, the substrate 10A may include a first piezoelectric substrate, and/or the substrate 10B may include a second piezoelectric substrate. Piezoelectric materials may include piezoelectric single crystals, piezoelectric polycrystals (including piezoelectric ceramics), piezoelectric polymers, and/or piezoelectric composite materials. For example, piezoelectric materials may include zinc oxide (ZnO), aluminum nitride (AlN), lithium tantalate (LiTaO3, LT), lithium niobate (LN), quartz (QZ), lead titanate (PTO), lead zirconate titanate (PZT) and a combination thereof. In further embodiments, the substrate 10A and/or the substrate 10B may include a base plate and a piezoelectric material layer disposed on the base plate. The material for the base plate may include silicon.

For example, the material for the electrodes 20A and/or 20B may include molybdenum (Mo), copper (Cu), aluminum (Al), gold (Au), platinum (Pt), tungsten (W), other suitable metals, alloys, and a combination thereof.

The material for the film 45A and/or 45B may include polymer dry film and/or metal. Taking metal as an example, the conductive film 45A and/or 45B may be configured as a metal cap and may be grounded, thereby providing shielding from coupling or interference. For example, electromagnetic interference (EMI) between the electrode 20A and the electrode 20B may be reduced. The material for the sidewalls 40A and 40B may include polymer dry films and/or metals. In some embodiments, the side wall 40A may be formed as part of the film 45A, that is, the side wall 40A and the film 45A may be formed monolithically. The material for the first passivation layer and/or the second passivation layer may include silicon dioxide (SiO2) and silicon nitride (SiN).

The acoustic wave device 1 may further include a connection 33, which may be disposed to contact the substrate 10A and to contact the substrate 10B. For example, the connection 33 may be disposed to contact both the surface S2 of the substrate 10A and the surface S3 of the substrate 10B. As shown in FIG. 1, the connection 33 may include a contact pad 32A, a conductive portion 30, and a contact pad 32B. The contact pad 32A may be disposed on the surface S2 of the substrate 10A, and the contact pad 32B may be disposed on the surface S3 of the substrate 10B. In the vertical direction Y, the contact pads 32A and 32B may be at least partially aligned with each other. In this embodiment, the contact pads 32A and 32B may be substantially completely aligned with each other. The conductive portion 30 may be disposed to contact the contact pad 32A and contact the contact pad 32B.

In some embodiments not shown, the connection 33 may include a through-via, and the through-via may penetrate through the substrate 10A and/or the substrate 10B, so as to achieve electrical connection or grounding.

In further embodiments, the connection 33 may be used to provide functions such as electrical connection, buffering, and/or support. In detail, the contact pad 32A of the connection 33 may be electrically connected to the electrodes 20A. The contact pad 32B may be electrically connected to the electrodes 20B. The conductive portion 30 may be electrically connected to the electrodes 20A via the contact pad 32A. The conductive portion 30 may be electrically connected to the electrodes 20B via the contact pad 32B. Therefore, the connection 33 (including the contact pad 32A, the conductive portion 30, and the contact pad 32B) may electrically be used to connect the electrodes 20A with the electrodes 20B. In this embodiment, a radio frequency signal may be transmitted in any appropriate direction between the electrodes 20A and the electrodes 20B via the connection 33. For example, a first filtered signal and a second filtered signal may respectively be output from the electrodes 20A and the electrodes 20B via the conductive portion 30. In addition, for example, by ways of flip chip technology, when the second chip (including at least the substrate 10B and the electrodes 20B) is stacked on the first chip (at least including the substrate 10A and the electrodes 20A), the conductive portion 30 of the connection 33 may provide a buffer between the two chips, so as to prevent the electrodes 20A and the electrodes 20B from collapsing, deformation or performance compromise. Furthermore, the conductive portion 30 may be a structural support and may be advantageous for a more stable stacked structure by ways of avoiding tilting.

In other embodiments, the connection 33 may not be used to provide an electrical connection function. In detail, the contact pad 32A may not be electrically connected to the electrodes 20A. Additionally or alternatively, the contact pad 32B may not be electrically connected to the electrodes 20B. Alternatively, the conductive portion 30 may not directly contact the contact pad 32A and/or the contact pad 32B. For example, an additional insulation layer may be provided between the conductive portion 30 and the contact pad 30A, such that the contact pad 30A is electrical insulated from the contact pad 30B. In this embodiment, the connection 33 may only be configured for buffering and supporting, and may be electrical insulated from the electrodes 20A or the electrodes 20B.

In some embodiments, as shown in FIG. 1, the connection 33 may be disposed outside the side wall 40A and/or the side wall 40B, that is, disposed at an outer side of the side wall 40A and/or the side wall 40B. Specifically, taking the side wall 40A as an example, the electrodes 20A located within the cavity 70A may be located inside the side wall 40A, and the connection 33 may be located outside the cavity 70A, that is, located outside the side wall 40A. In other words, the inner side of the side wall 40A may be defined as the side thereof closer to the electrodes 20A, and the outer side of the side wall 40A may be defined as the opposite side to the inner side.

In some embodiments, the acoustic wave device 1 may further include a mainboard 50 disposed at the surface S1 of the substrate 10A. The mainboard 50 may include a surface S5 and a surface S6. The surface S1 of the substrate 10A may be connected to the surface S6 of the mainboard 50 via an adhesion layer (not illustrated). For example, the mainboard 50 may include a printed circuit board. In such an embodiment, the acoustic wave device 1 may further include a connection 35 that may be disposed to contact the substrate 10B and the mainboard 50. For example, the connection 35 may be disposed to contact both the surface S3 of the substrate 10B and the surface S6 of the mainboard 50. As shown in FIG. 1, the connection 35 may include a contact pad 34A, a conductive portion 31, and a contact pad 34B. The contact pad 34A may be disposed on the surface S6 of the mainboard 50, and the contact pad 34B may be disposed on the surface S3 of the substrate 10B. In the vertical direction Y, the contact pads 34A and 34B may be at least partially aligned with each other. In this embodiment, the contact pads 34A and 34B may be substantially completely aligned with each other. The conductive portion 31 may be disposed to contact the contact pad 34A and contact the contact pad 34B. The function of the connection 35 may be similar to that of the connection 33 described above and therefore may be omitted for the sake of simplicity. In some embodiments, the contact pad 34A on the mainboard 50 may be used for electrical grounding. In some embodiments, the connection 35 may include a through-via, and the through-via may penetrate through the substrate 10B and/or the mainboard 50.

For example, the material for the conductive portion 30 and/or the conductive portion 31 may include gold or tin (stannum). For example, the material for the conductive portion 30 may be gold, and the material for the conductive portion 31 may be tin. In addition, the conductive portion 30 and/or the conductive portion 31 may be substantially spherical or columnar, and the spherical shape may comprise a substantially circular cross-section along the vertical direction Y. The material for contact pads 32A, 32B and/or contact pads 34A, 34B may include tin.

The acoustic wave device 1 may further include a sealing element 60 for filling the gaps in the acoustic wave device 1 to ensure airtightness. The sealing element 60 may be formed by ways of transfer molding or compression molding. For example, the transfer molding may be performed under a pressure of 8 to 9 megapascals (Mpa), so as to form the sealing element 60, while the compression molding may be performed under a pressure of 0.5 to 5 Mpa. The material for the sealing element 60 may include resin.

Although the acoustic wave device 1 shown in FIG. 1 includes two stacked SAW chips, those skilled in the art may apply the principles of the present invention to stack other numbers of SAW chips in the acoustic wave device 1 as desired.

Figure 2:
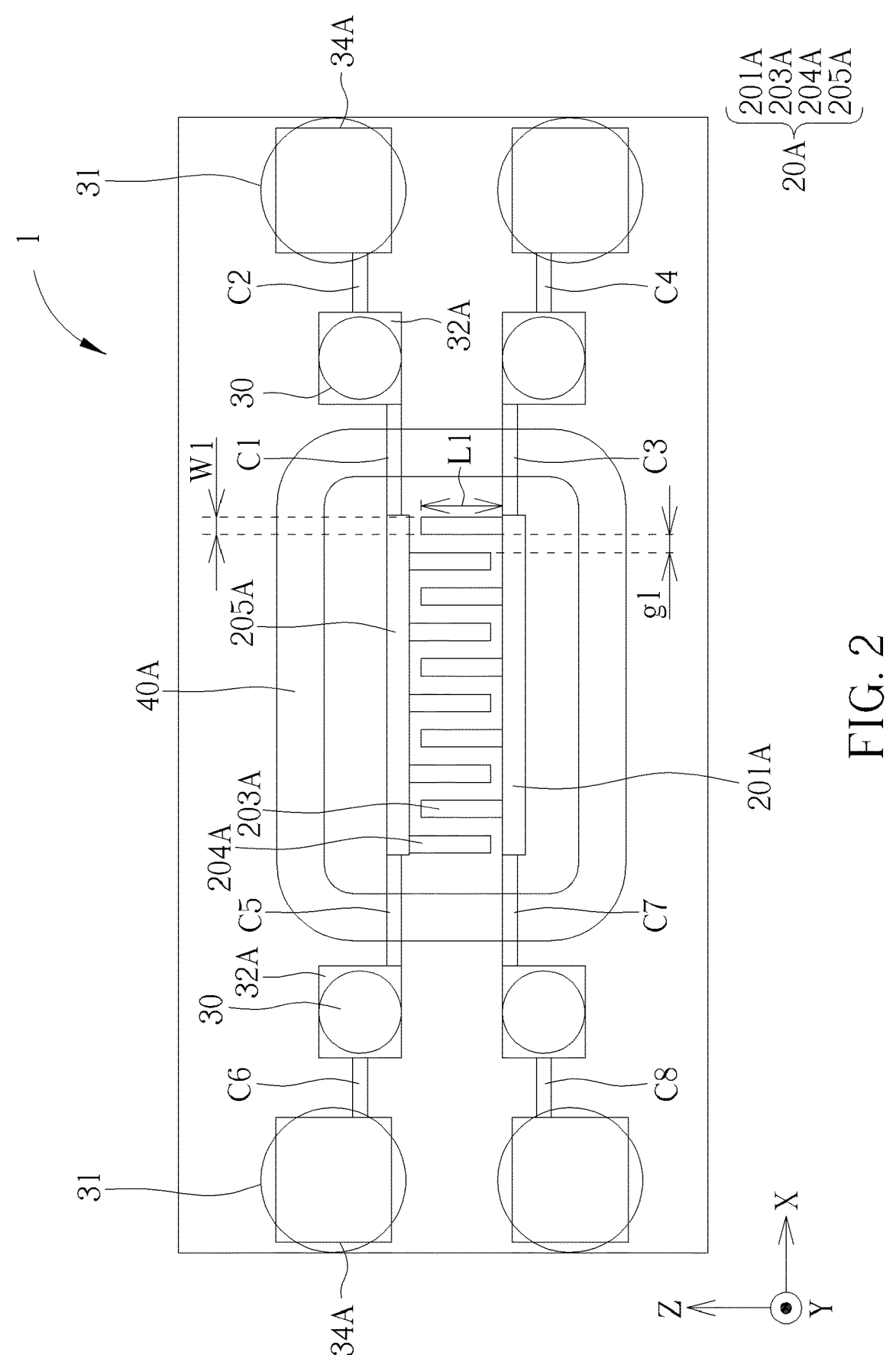
FIG. 2 is a schematic top view of an acoustic wave device according to an embodiment of the present invention.

FIG. 2 is a schematic top view of an acoustic wave device 1 according to an embodiment of the present invention. For the purpose of clarity of illustration, this top view may schematically omit some elements, or may additionally show some elements that may be obscured by other elements or components. As shown in the figure, taking the first chip as an example, the plurality of electrodes 20A may be configured as an interdigital structure, and they may be located in a rectangular area defined by the side walls 40A. For example, the plurality of electrodes 20A may include an input electrode 201A, a plurality of transducing electrodes 203A, a plurality of transducing electrodes 204A, and an output electrode 205A. In detail, the input electrode 201A may extend along the horizontal direction X. Each of the plurality of transducing electrodes 203A may extend from the input electrode 201A along a horizontal direction Z and may be arranged at intervals along the horizontal direction X. As shown in FIG. 2, each of the transducing electrodes 203A may be spaced apart from the output electrode 205A at the end thereof away from the input electrode 201A. Similarly, the output electrode 205A may extend along the horizontal direction X. Each of the plurality of transducing electrodes 204A may extend from the output electrode 205A along the horizontal direction Z, and may be arranged at intervals along the horizontal direction X. As shown in FIG. 2, each of the transducing electrode 204A may be spaced apart from the input electrode 201A at the end thereof away from the output electrode 205A. Furthermore, each of the plurality of transducing electrodes 203A may be separated from any one of the plurality of transducing electrodes 204A. For example, the plurality of transducing electrodes 203A and the plurality of transducing electrodes 204A may be alternately arranged along the horizontal direction X. That is, one transducing electrode 203A may be located between adjacent two of the plurality of transducing electrodes 204A. However, the present invention may be not limited thereto, and in other embodiments, no transducing electrode 203A is located between adjacent two of the plurality of transducing electrodes 204A, or two or more transducing electrodes 203A may be located between adjacent two of the plurality of transducing electrodes 204A.

In some embodiments, the input electrodes 201A or 205A may be also referred to as busbars or busbar electrodes, and the transducing electrodes 203A or 204A may be also referred to as interdigital electrodes or IDT. In some embodiments, the horizontal direction Z and the horizontal direction X may be both in parallel to, for example, the surface S1 of the substrate 10A, and the horizontal direction Z may be perpendicular to the horizontal direction X. However, the present invention may be not limited thereto. In other examples, an angle other than 90 degrees may be formed between the horizontal direction Z and X. It should be noted that the input electrodes and/or output electrodes referenced here may be merely named to distinguish different electrodes and are not intended to limit the meaning. In other words, in other embodiments, the input electrodes referred to herein may be alternatively used to output signals, and the output electrodes may be alternatively used to input signals.

In some embodiments, one of the transducing electrodes 203A and/or 204A may have an electrode length L1, an electrode width W1, and an electrode thickness T1 (not marked in FIG. 2). In the case where the transducing electrodes 203A and 204A may be alternately arranged, there may be an electrode gap g1 between the transducing electrodes 203A and 204A.

Similarly, the electrode 20B of the second chip may also be configured as an interdigital structure, and they may be located in a rectangular area defined by the side wall 40B. The arrangement of the plurality of electrodes 20B may be similar to the plurality of electrodes 20A above-mentioned, and the details thereof will not be repeated here. It should be noted that the second chip may have the following parameters: an electrode length L2, an electrode width W2, an electrode thickness T2, and an electrode gap g2. Furthermore, the first chip and the second chip may be different from each other in at least one of the followings: the electrode length, the electrode width, the electrode thickness, and the electrode gap, so that the first chip and the second chip may be respectively configured for different wavelengths or different frequencies. Specifically, the electrode length L1 may be different from the electrode length L2, the electrode width W1 may be different from the electrode width W2, the electrode thickness T1 may be different from the electrode thickness T2, and/or the electrode gap g1 may be different from the electrode gap g2.

Referring to both FIGS. 1 and 2, the traces C1, C5, C3, and/or C7 may be formed on the surface S2 of the substrate 10A and may be provided to couple the electrode 20A and the contact pad 32A. For example, the input electrode 201A of the electrode 20A may be coupled to the contact pad 32A of the connection 33 via the trace C3 or C7, and the output electrode 205A of the electrode 20A may be coupled to the contact pad 32A of the connection 33 via the trace C1 or C5. In some embodiments, any of the traces C1, C5, C3, C7 may be omitted as desired. Besides, the traces C2, C4, C6, and/or C8 may be formed on the surface S3 of the substrate 10B and may be provided to couple the connection 33 and the connection 35. For example, the contact pad 32B of the connection 33 may be coupled to the contact pad 34B of the connection 35 via the traces C2, C4, C6, and/or C8. In this embodiment, for example, a transmission path for the radio frequency signal may include at least the trace C5, the contact pad 32A, the conductive portion 30, the contact pad 32B, the trace C6, the contact pad 34B, the conductive portion 31, and the contact pad 34A.

Figure 3:
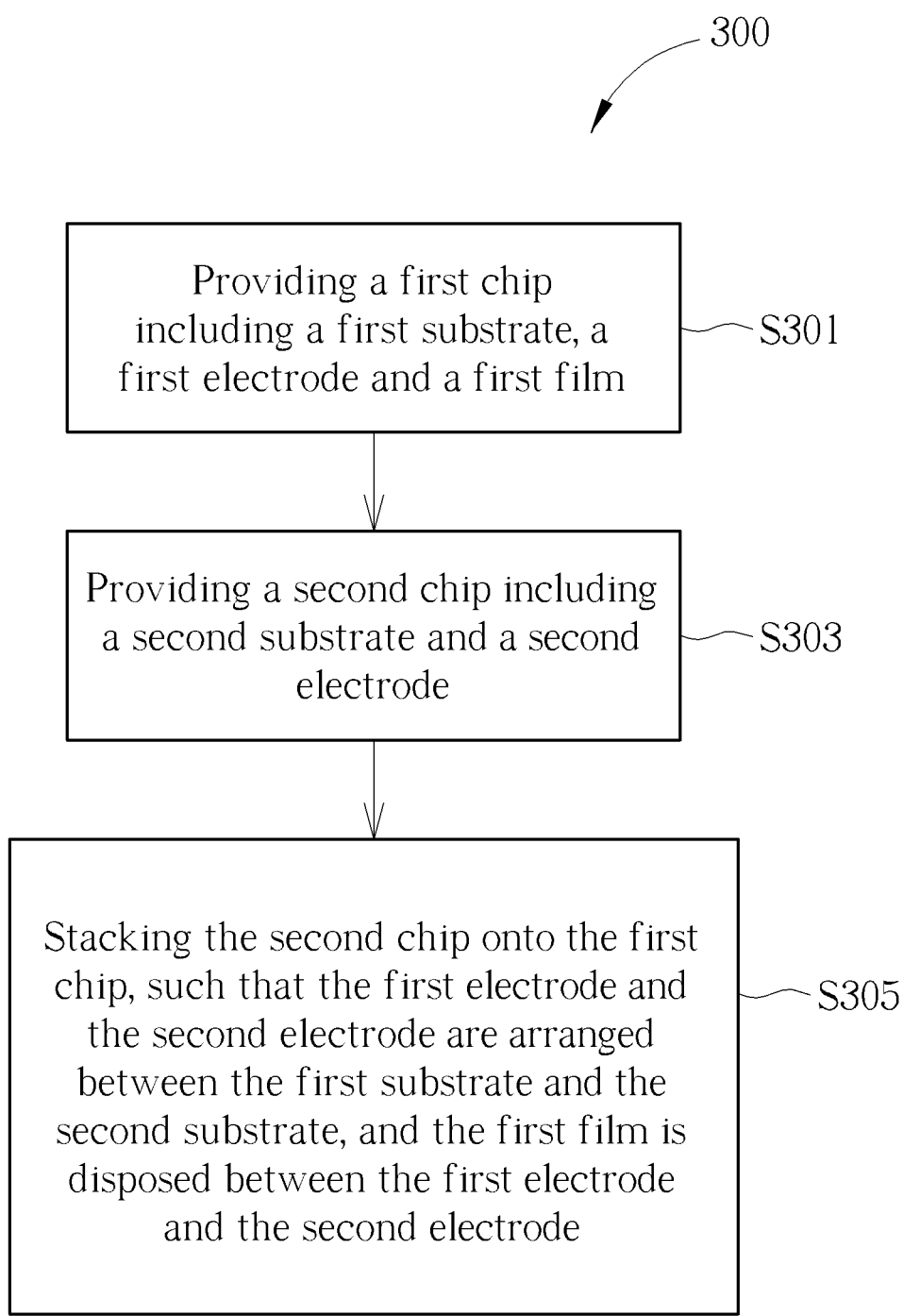
FIG. 3 is a schematic flow chart of a fabricating method of an acoustic wave device according to an embodiment of the present invention.

FIG. 3 is a schematic flow chart of a fabricating method of an acoustic wave device 1 according to an embodiment of the present invention. The manufacturing method 300 may include steps S301 to S305, and by ways of these steps, a first chip comprising a plurality of electrodes 20A may be stacked to a second chip comprising a plurality of electrodes 20B, for example, via a flip chip technology, so as to fabricate the acoustic wave device 1. Any reasonable technical changes or step adjustments may fall within the scope disclosed by the present invention. Steps S301 to S305 may be detailed as follows:

Step S301: providing a first chip including a first substrate, a first electrode and a first film;

Step S303: providing a second chip including a second substrate and a second electrode;

Step S305: stacking the second chip onto the first chip, such that the first electrode and the second electrode are arranged between the first substrate and the second substrate, and the first film is disposed between the first electrode and the second electrode.

The steps of the fabricating method 300 may be explained below with reference to FIG. 1. In step S301, the first chip may include a first substrate 10A, a plurality of first electrodes 20A, and a first film 45A. In step S303, the second chip may include a second substrate 10B, a plurality of second electrodes 20B, and a second film 45B. In step S305, the second chip may be stacked onto the first chip by ways of, for example, a flip chip technology, such that the first electrode 20A and the second electrode 20B are arranged between the first substrate 10A and the second substrate 10B. The first film 45A is disposed between the first electrode 20A and the second electrode 20B, and the second film 45B may also be disposed between the first electrode 20A and the second electrode 20B.

For example, a contact pad 32A and a conductive portion 30 may be provided on the first substrate 10A of the first chip, and a contact pad 32B may be provided on the second substrate 10B of the second chip. In step S305, when the second chip is stacked on the first chip, the conductive portion 30 on the first substrate 10A may be bonded to the contact pad 32B on the second substrate 10B. However, the present invention may be not limited thereto. In other embodiments, before the step of stacking, a conductive portion may be additionally or alternatively disposed on the second substrate 10B of the second chip.

During step S305, the first film 45A covers on and protects the plurality of first electrodes 20A from contamination or collapsing, and the second film 45B covers on and protects the plurality of second electrodes 20B from contamination or collapsing. With the buffering and supporting functions provided by the connection 33 (which may include the contact pad 32A, the conductive portion 30, and the contact pad 32B), there may be less strictness needed for the alignment of the second chip and the first chip during the step of stacking, and thus the difficulty of the step may be reduced. In some embodiments, the first and second chips may be configured for different frequencies, and the second film 45B of the second chip may be omitted.

Furthermore, a contact pad 34B may be provided on the second substrate 10B of the second chip. A contact pad 34A and a conductive portion 31 may be provided on the mainboard 50. In subsequent steps (not shown), for example, the second chip may be bonded to the mainboard 50 by ways of a flip chip technology, where the contact pad 34B on the second substrate 10B may be bonded to the conductive portion 31 on the mainboard 50. However, the present invention may be not limited thereto. In other embodiments, before the step of the second chip being bonded to the mainboard 50, a conductive portion may be additionally or alternatively disposed on the second substrate 10B of the second chip.

In some embodiments, in subsequent steps (not shown), transfer molding or compression molding may be used to form a sealing element 60, which fills the gaps in the acoustic wave device 1 to ensure airtightness.

Figure 4:
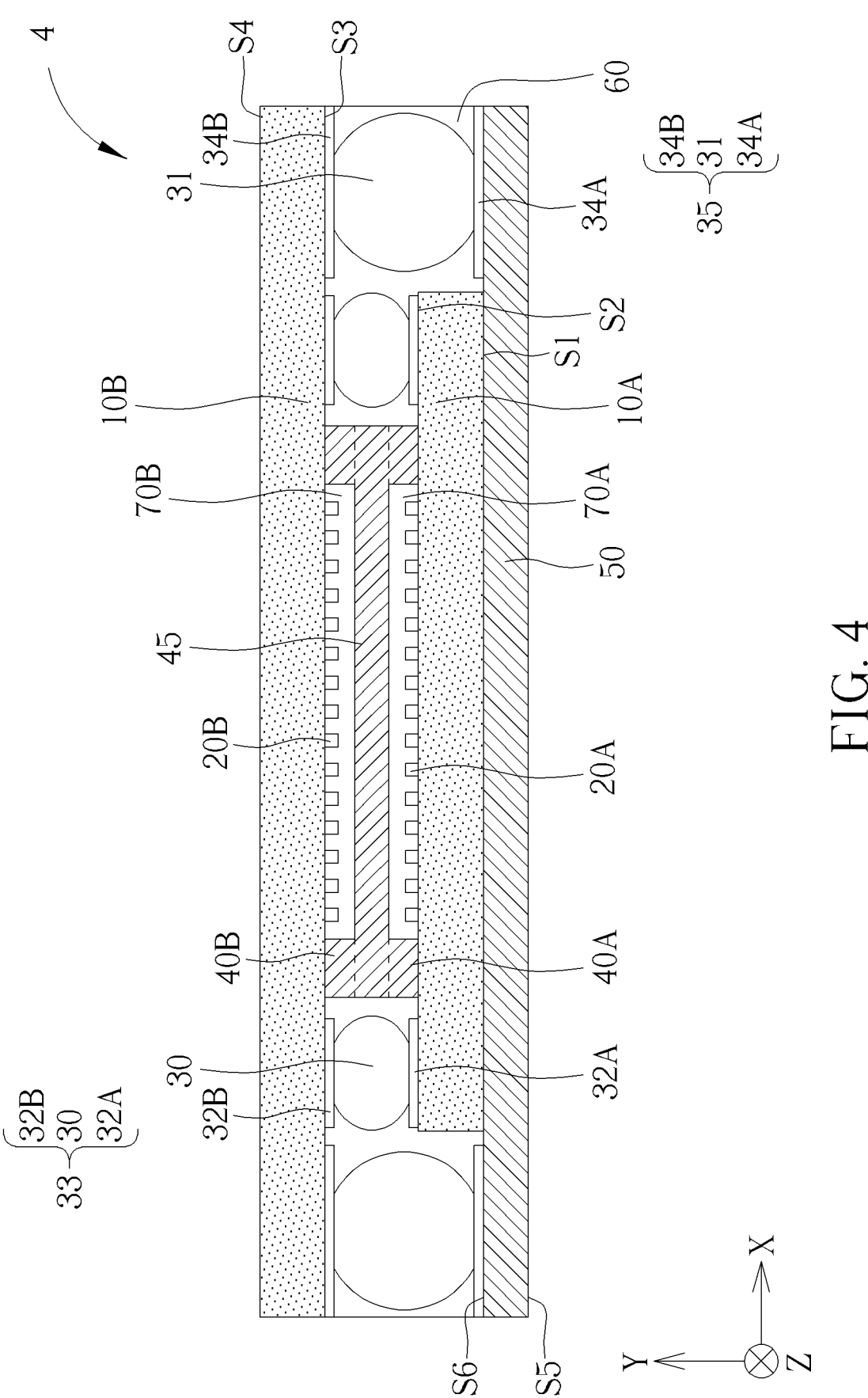
FIG. 4 is a schematic cross-sectional view of an acoustic wave device according to another embodiment of the present invention.

FIG. 4 is a schematic cross-sectional view of an acoustic wave device 4 according to another embodiment of the present invention. The acoustic wave device 4 is similar to the acoustic wave device 1, and a significant difference there-between may be that double films are illustrated between the electrode 20A and the electrode 20B in the acoustic wave device 1, such as films 45A and 45B, while a single-film is illustrated between electrodes 20A and 20B in the acoustic wave device 4, such as film 45. Configurations or operations of other components in the acoustic wave device 4 may be similar to those in the acoustic wave device 1 and may not be repeated.

According to an embodiment of the present invention, in the acoustic wave device and the fabricating method, at least two surface acoustic wave chips may be appropriately stacked, and the footprint or circuit area occupied by the acoustic wave device may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An acoustic wave device, comprising:
a first substrate, comprising a first surface and a second surface;
a plurality of first electrodes disposed on the second surface of the first substrate;
a second substrate, comprising a third surface and a fourth surface;
a plurality of second electrodes, disposed on the third surface of the second substrate, wherein the second surface of the first substrate faces the third surface of the second substrate, such that the plurality of first electrodes and the plurality of second electrodes are arranged between the first substrate and the second substrate;
a first film, disposed between the plurality of first electrodes and the plurality of second electrodes; and
a first side wall, disposed on the second surface of the first substrate and at least partially surrounding the plurality of first electrodes;
wherein the first film covers on the first side wall; and
wherein the first substrate, the first side wall, and the first film are disposed to form a first cavity and the plurality of first electrodes are disposed within the first cavity.

2. The acoustic wave device of claim 1, wherein:
the material for the first film includes polymer dry film and/or metal.

3. The acoustic wave device of claim 1, further comprising:
a second side wall disposed on the third surface of the second substrate and at least partially surrounding the plurality of second electrodes.

4. The acoustic wave device of claim 3, further comprising:
a second film, covering on the second side wall;

wherein the second substrate, the second side wall, and the second film are disposed to form a second cavity and the plurality of second electrodes being disposed within the second cavity.

5. The acoustic wave device of claim 3, further comprising:
a first connection, disposed to contact the first substrate and the second substrate;
wherein the first connection is disposed between the second surface of the first substrate and the third surface of the second substrate.

6. The acoustic wave device of claim 5, wherein:
the first connection comprises:
a first contact pad, disposed on the second surface of the first substrate;
a second contact pad, disposed on the third surface of the second substrate and at least partially aligned with the first contact pad in a vertical direction; and
a first conductive portion, disposed to contact the first contact pad and the second contact pad.

7. The acoustic wave device of claim 6, wherein the first contact pad is electrically connected to the plurality of first electrodes, and/or the second contact pad is electrically connected to the plurality of second electrodes.

8. The acoustic wave device of claim 6, wherein the material for the first conductive portion includes gold and tin.

9. The acoustic wave device of claim 5, further comprising:
a mainboard, disposed at the first surface of the first substrate.

10. The acoustic wave device of claim 9, wherein:
the mainboard comprises a fifth surface and a sixth surface, and the first surface of the first substrate is connected to the sixth surface of the mainboard via an adhesion layer; and
the acoustic wave device further comprises a second connection disposed to contact the second substrate and the mainboard and second connection is disposed between the third surface of the second substrate and the sixth surface of the mainboard.

11. The acoustic wave device of claim 10, wherein:
the second connection comprises:
a third contact pad, disposed on the sixth surface of the mainboard;
a fourth contact pad, disposed on the third surface of the second substrate and at least partially aligned with the third contact pad in a vertical direction; and
a second conductive portion, disposed to contact the third contact pad and the fourth contact pad.

12. The acoustic wave device of claim 11, wherein the material for the second conductive portion includes gold and tin.

13. The acoustic wave device of claim 11, wherein the fourth contact pad is electrically connected to the second contact pad, and/or the third contact pad is electrically connected to ground.

14. The acoustic wave device of claim 5, wherein the first connection is disposed at an outer side of the first side wall or at an outer side of the second side wall.

15. The acoustic wave device of claim 3, wherein the material for the first side wall includes a polymer dry film, and the material for the second side wall includes a polymer dry film.

16. The acoustic wave device of claim 3, wherein the first side wall and the second side wall are at least partially aligned in a vertical direction.

17. The acoustic wave device of claim 1, wherein:

the first substrate includes a first piezoelectric substrate; and the second substrate includes a second piezoelectric substrate.

18. The acoustic wave device of claim 1, wherein:

the plurality of first electrodes include a first input electrode, a first transducing electrode, and a first output electrode; and the plurality of second electrodes include a second input electrode, a second transducing electrode, and a second output electrode.

19. The acoustic wave device of claim 18, wherein:

the first transducing electrode and the second transducing electrode are configured for different wavelengths.

20. The acoustic wave device of claim 18, wherein:

the first transducing electrode and the second transducing electrode are different in at least one of the followings: an electrode length, an electrode width, an electrode thickness and/or an electrode gap.

21. A method of fabricating an acoustic wave device, comprising:

providing a first chip, the first chip comprising a first substrate, a first electrode and a first film;

providing a second chip, the second chip comprising a second substrate and a second electrode;

stacking the second chip on the first chip, such that the first electrode and the second electrode are arranged between the first substrate and the second substrate, and the first film is disposed between the first electrode and the second electrode; and providing a first side wall, the first side wall being disposed on the second surface of the first substrate and at least partially surrounding the first electrode;

wherein the first film covers on the first side wall; and wherein the first substrate, the first side wall, and the first film are disposed to form a first cavity and the first electrode is accommodated within the first cavity.

22. The method of claim 21, wherein:

the second chip comprises a second film; and stacking the second chip on the first chip, such that the second film is disposed between the first electrode and the second electrode.

\* \* \* \* \*